(12) United States Patent
Nomura et al.

(10) Patent No.: US 7,417,318 B2
(45) Date of Patent: Aug. 26, 2008

(54) THICK FILM CIRCUIT BOARD, METHOD OF PRODUCING THE SAME AND INTEGRATED CIRCUIT DEVICE

(75) Inventors: Tohru Nomura, Kariya (JP); Yoshihiro Shimoide, Aichi-pref (JP); Yoshihiko Shiraishi, Nagoya (JP); Rikiya Kamimura, Toyoake (JP); Hiroshi Kasugai, Toyoake (JP)

(73) Assignee: Denso Corporation (JP)

( * ) Notice: Subject to any disclaimer, the term of this patent is extended or adjusted under 35 U.S.C. 154(b) by 265 days.

(21) Appl. No.: 10/831,229

(22) Filed: Apr. 26, 2004

(65) Prior Publication Data

US 2004/0212085 A1    Oct. 28, 2004

(30) Foreign Application Priority Data

Apr. 25, 2003  (JP) .............................. 2003-122426
Mar. 2, 2004   (JP) .............................. 2004-057401

(51) Int. Cl.
*H01L 23/48* (2006.01)
(52) U.S. Cl. .................................................... 257/774
(58) Field of Classification Search ................ 257/621, 257/666, 700–777, E23.036; 361/795
See application file for complete search history.

(56) References Cited

U.S. PATENT DOCUMENTS

| | | | | |
|---|---|---|---|---|
| 6,630,743 | B2* | 10/2003 | Magnuson et al. | 257/774 |
| 7,042,098 | B2* | 5/2006 | Harun et al. | 257/774 |
| 2002/0149312 | A1* | 10/2002 | Roberts et al. | 313/495 |
| 2003/0116857 | A1* | 6/2003 | Taniguchi et al. | 257/774 |
| 2004/0070915 | A1* | 4/2004 | Nagai et al. | 361/234 |
| 2004/0195669 | A1* | 10/2004 | Wilkins et al. | 257/698 |
| 2005/0236177 | A1* | 10/2005 | Inagaki et al. | 174/255 |

FOREIGN PATENT DOCUMENTS

| JP | 11-177016 A | 7/1999 |
|---|---|---|
| JP | 2000-312062 | 11/2000 |

* cited by examiner

*Primary Examiner*—Nathan W Ha
(74) *Attorney, Agent, or Firm*—Nixon & Vanderhye PC

(57) ABSTRACT

A thick film circuit board that can be produced at a low cost, a method of producing the same, and an integrated circuit device. A first thick film circuit board has conducting layers of a copper-containing conductor fired at not higher than 750° C., and includes conducting portions formed by using a silver-containing conductor. A second thick film circuit board has conductors that are formed in the through holes so as to close the openings of at least the one side thereof. The thick film circuit board is produced at a low cost and suppresses a drop in electric conductivity when it is in use.

13 Claims, 9 Drawing Sheets

THICK FILM CIRCUIT BOARD, METHOD OF PRODUCING THE SAME AND INTEGRATED CIRCUIT DEVICE

BACKGROUND OF THE INVENTION

1. Field of the Invention

The present invention relates to a thick film circuit board and to a method of producing the same. More specifically, the invention relates to a thick film circuit board that can be produced at a low cost, to a method of producing the same and to an integrated circuit device using the thick film circuit board.

2. Description of the Related Art

In the thick film circuit board in a hybrid integrated circuit device, conducting layers of an electric circuit are formed on both surfaces of an insulating base member in order to decrease the size. The conducting layers formed on both surfaces of the base member are made of a conductor formed depending upon a predetermined circuit pattern. The conducting layers formed on both surfaces of the base member are electrically connected together through conducting portions that maintain electric conduction in through holes formed penetrating through the base member.

The conducting layers and the conducting portions are made of a silver-containing conductor or a copper-containing conductor. The conductors are formed by firing an alloy material on the surfaces of the base member (see Japanese Unexamined Patent Publications (Kokai) Nos. 11-177016 and 2000-312062).

The silver-containing conductor easily develops electromigration and has a problem concerning the reliability. Therefore, a silver-containing conductor to which palladium is added has been devised accompanied, however, by a problem of low electric conduction.

Further, since copper by itself tends to be easily oxidized, the atmosphere must be controlled when the copper-containing conductor is to be fired, thus driving up the cost. The atmosphere must be controlled even when a resistor is to be fired in the circuit pattern. Therefore, a limitation is imposed on the material for forming the resistor, also driving up the cost. As the copper-containing conductors, there have been known high-temperature fired copper that is fired at 800 to 900° C. and low-temperature fired copper that is fired at 600 to 700° C.

SUMMARY OF THE INVENTION

The present invention was accomplished in view of the above circumstances and has an object of providing a thick film circuit board that can be produced at a low cost, a method of producing the same, and an integrated circuit device.

In order to solve the above problem, the inventors have studied the thick film circuit board and have arrived at the present invention.

A first thick film circuit board of the invention comprises:
an insulating base member having through holes penetrating through at predetermined positions thereof;
conducting layers formed on both surfaces of the base member depending upon a predetermined circuit pattern; and
conducting portions formed in the through holes to render the conducting layers formed on both surfaces of the base member to be electrically connected to each other;
wherein the conducting layers are formed by using a copper-containing conductor fired at not higher than 750° C., and the conducting portions are formed by using a silver-containing conductor.

In the thick film circuit board of the invention, the members such as the conducting layers and conducting portions are fired at temperatures that can be set in the furnace environment of a firing furnace, and may be locally fired at temperatures higher than the temperatures that are set.

The thick film circuit board of the invention is produced by being fired a decreased number of times (being heat-treated a decreased number of times) because the copper-containing conductor constituting the conducting layers is fired at a temperature of not higher than 750° C. Therefore, the cost can be decreased.

A method of producing a first thick film circuit board of the invention comprises the steps of:
applying a silver-containing paste which, when fired, is capable of forming conducting portions onto at least inner peripheral surfaces of through holes in the base member having the through holes;
forming conducting portions by firing the silver-containing paste; and
applying a copper-containing paste which, when fired at a predetermined temperature of not higher than 750° C., is capable of forming conducting layers onto the surfaces of the base member forming the conducting portions depending upon a predetermined circuit pattern, and forming the conducting layers by the firing at the predetermined temperature.

A first integrated circuit device of the invention comprises:
a thick film circuit board which includes:
an insulating base member having through holes penetrating through at predetermined positions thereof;
conducting layers formed on both surfaces of the base member depending upon a predetermined circuit pattern; and
conducting portions formed in the through holes to render the conducting layers formed on both surfaces of the base member to be electrically conductive to each other;
wherein the conducting layers are formed by using a copper-containing conductor fired at not higher than 750° C., and the conducting portions are formed by using a silver-containing conductor; and
an electric element placed on the thick film circuit board.

A second thick film circuit board of the invention comprises:
an insulating base member having through holes penetrating through at predetermined positions thereof;
conducting layers formed on both surfaces of the base member depending upon a predetermined circuit pattern; and
conducting portions formed in the through holes to render the conducting layers formed on both surfaces of the base member to be electrically conductive to each other;
wherein conductors are formed in the through holes so as to close openings of the through holes on at least one side thereof.

A method of producing a second thick film circuit board of the invention comprises the steps of:
forming conducting portions in at least inner peripheral surfaces of through holes in a base member having the through holes; and
applying a copper-containing paste which, when fired, is capable of forming conducting layers onto the surfaces of the base member forming the conducting portions depending upon a predetermined circuit pattern in a manner to cover openings of the through holes on one side thereof and forming the conducting layers by firing at the predetermined temperature.

A second integrated circuit device of the invention comprises:

a thick film circuit board which includes:
an insulating base member having through holes penetrating through at predetermined positions thereof;
conducting layers formed on both surfaces of the base member depending upon a predetermined circuit pattern; and
conducting portions formed in the through holes to render the conducting layers formed on both surfaces of the base member to be electrically conductive to each other;
wherein the conductors are formed in the through holes so as to close openings of the through holes on at least one side thereof; and
an electric element mounted on the thick film circuit board.

The first thick film circuit board of the invention is produced by being fired a decreased number of times (being heat-treated a decreased number of times) because the copper-containing conductor constituting the conducting layers is fired at a temperature of not higher than 750° C. Therefore, the cost can be decreased.

According to the production method of the present invention, the first thick film circuit board of the invention is produced by being fired a decreased number of times (being heat-treated a decreased number of times) because the copper-containing conductor constituting the conducting layers is fired at a temperature of not higher than 750° C. Therefore, the thick film circuit board can be produced at a decreased cost.

The first integrated circuit device of the invention has an electric element mounted on the first thick film circuit board. Therefore, the integrated circuit device is obtained at a decreased cost.

The second thick film circuit board of the invention suppresses the generation of voids when an electric element is mounted on the through holes.

The production method of the invention is capable of producing the second thick film circuit board suppressing the generation of voids when an electric element is mounted on the through holes.

The second integrated circuit device of the invention has an electric element mounted on the second thick film circuit board, and suppresses a decrease in the electric conduction when it is being used.

Figure 1:
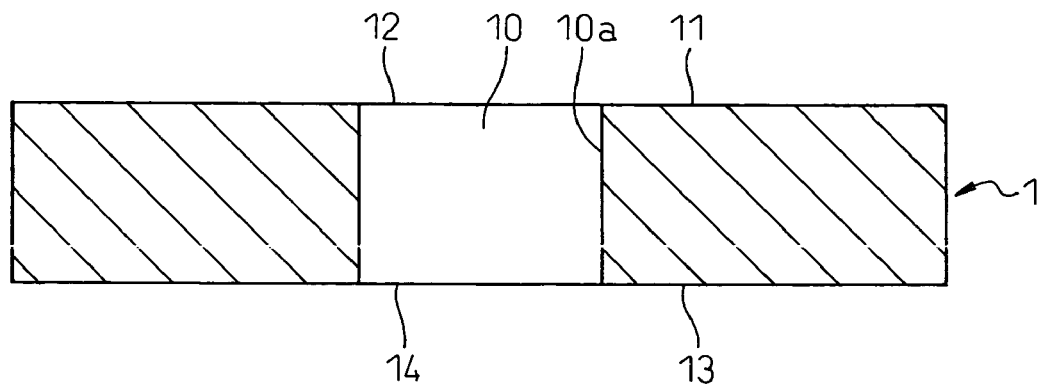
FIG. 1 is a sectional view illustrating the vicinity of a through hole in the base member according to Example 1.

DETAILED DESCRIPTION OF THE INVENTION (First Invention)

A thick film circuit board of the present invention is constituted by a base member, conducting layers and conducting portions. The conducting layers of the thick film circuit board are formed by the thick film formation method, in which a paste is coated and then fired to form the thick film layers.

The base member is made of an insulating member having through holes penetrating through at predetermined positions. The base member is a member that has heretofore been used as a base member for the thick film circuit boards. As the base member, there can be used a plate-like ceramic board having heat resistance and insulating property. Namely, the base member is desirably made of a ceramic. The ceramic forming the base member may be the one that has heretofore been known. The ceramic is desirably an alumina ceramic.

The conducting layers are formed on both surfaces of the base member depending upon a predetermined circuit pattern. Both surfaces of the base member stand for both surfaces of the base member in which the through holes are opening. The conducting layers form electric circuits on the base member.

The conducting portions are formed in the through holes to render the conducting layers formed on both surfaces of the base member electrically connected to each other. Electric circuits are formed on both surfaces of the base member as the conducting portions electrically connect together the conducting layers formed on both surfaces of the base member, and the thick film circuit board is realized in a small size. With the conducting portions being formed in the through holes, further, the conducting layers need not connect to each other through the outer side of the base member. Therefore, the thick film circuit can be realized in a highly densely integrated form, and the thick film circuit board can be obtained in a small size.

The conducting layers are formed by using a copper-containing conductor fired at not higher than 750° C., and the conducting portions are formed by using a silver-containing conductor. Usually, the silver-containing conductor used for the thick film circuit board is fired at a temperature of about 850° C. Namely, in the thick film circuit board of the present invention, the conducting layers are fired at a temperature lower than a temperature at which the conducting portions are fired. After the conducting portions are fired, the conducting layers can be fired. The conducting portions made of the silver-containing conductor can be fired in an atmosphere. Therefore, the conducting portions are fired at a low cost.

The silver-containing conductor forming the conducting portions is the one that has heretofore been known. The silver-containing conductor is preferably mainly composed of silver, more preferably composed of at least 80% by mass of silver, particularly essentially composed of silver. A silver alloy as the silver-containing conductor may contain a noble metal such as palladium and platinum, in addition to copper. Namely, there can be used a conductor such as pure silver or silver to which palladium is added.

The copper-containing conductor forming the conducting layers is fired at a temperature of not higher than 750° C. The copper-containing conductor is fired in an inert gas atmosphere. Here, the inert gas atmosphere may be that of gas that does not react with the copper-containing conductor, such as of nitrogen, helium, neon or argon. Among them, a nitrogen gas is desirable since it is inexpensive.

The copper-containing conductor forming the conductor provided it has been fired at a temperature of not higher than 750° C. Preferably, the conductor is the one that is fired at 600 to 700° C. The copper-containing conductor is preferably composed of copper as a main component, more preferably composed of at least 98% by mass of copper, particularly essentially composed of copper.

It is desired that at least the conducting portions formed on the surfaces of the base member are covered with the conducting layers. With the conducting portions formed on the surfaces of the base member being covered with the conducting layers, the conducing portions made of the silver-containing conductor are suppressed from migrating or forming an insulating sulfide (AgS).

There is no particular limitation on the structure of the conducting portions provided they have been formed in the through holes so as to render the conducting layers formed on both surfaces of the base member to be electrically conductive to each other. Namely, either a film may be formed in the inner peripheral surfaces of the through holes or the through holes may be filled with the silver-containing conductor.

When the conducting portions have a film formed on the inner peripheral surfaces of the through holes, the silver-containing conductor is required in a decreased amount for forming the through holes. Namely, the expensive silver-containing conductor is used in a decreased amount, and the thick film circuit board can be produced at a decreased cost. In the present invention, the film-like conducting portions stand for a state where the conducting portions are provided so as to form cavities without filling the through holes with the silver-containing conductor, and are not limited to those of the form of thin films only.

It is desired that the conducting portions are such that the silver-containing conductor fills the through holes. With the silver-containing conductor filling the through holes, the conducting portions are formed at a decreased cost. Concretely speaking, when the conducting portions are to be formed on the inner peripheral surfaces of the through holes, a material capable of forming a silver-containing conductor is applied onto the inner peripheral surfaces of the through holes from the openings at both ends followed by firing thereby to fire the conducting portions. On the other hand, when the conducting portions are those formed by filling the through holes with the silver-containing conductor, then, a material capable of forming a silver-containing conductor is forcibly introduced into the through holes followed by firing. Namely, in forming the conducting portions, the number of steps is greatly decreased for arranging the material that forms the silver-containing conductor.

With the through holes being filled with the silver-containing conductor, the surfaces of the conducting portions are not dented and, besides, the conducting portions maintain a sufficiently large thickness at the corner portions of the through holes suppressing the occurrence of such problems as a defective opening and an increase in the resistance at the corners of the through holes.

Concretely speaking, in a state where the through holes are not filled with the conductor, the surfaces are dented in the opening portions of the through holes. If the element is joined to the dents by soldering, there develop voids in the solder, cracks develop from the defective void portions due to thermal stress in the junction areas, and openings become defective.

Besides, if the conductor constituting the conducting portions does not have enough thickness at the corners of the openings of the through holes, the conductor is all absorbed by the solder and the resistance increases in the through hole portions. To the thickness of the conductor and to flatten the through hole portions making, however, necessary to repetitively impart (print) the conductor resulting in an increase in the number of the working steps and in increase in the cost as a whole.

Further, the conductor imparted to the inner peripheral surfaces of the through holes shrinks due to the firing, and the through hole portions are dented. To fill the dents, the conductor must be imparted and fired again.

With the through holes being filled with the silver-containing conductor, further, the conducting portions start radiating heat. Concretely speaking, the conducting portions are made of the silver-containing conductor filling the through holes and possess a high thermal conductivity. That is, the heat of the conducting layer formed on one surface of the base member is conducted through the conducting portions to the other conducting layer formed on the other surface of the base member and is radiated. As a result, a stable thick film circuit is obtained.

It is desired that the conducting layers are formed in a manner of covering the through holes. The silver-containing conductor is not exposed at the ends of the silver conductor filling the through holes, and no migration takes place. As a result, the thick film circuit features improved reliability.

It is desired that the conducting layers have a resistor that is fired. The resistor may be the one that has heretofore been known. As the resistor, there can be used an $RuO_2$ resistor, an $SnO_2$ resistor or an $LaB_6$ resistor.

It is desired that the resistor is fired at a temperature higher than the temperature at which the conducting layers are fired. Namely, the resistor is fired in advance at a predetermined position on the surface of the base member and, then, the conducting layers are formed. By forming the resistor in the base member, no limitation is imposed on the conditions for firing the resistor. That is, there can be used a resistor fired in the atmosphere.

In the thick film circuit board of the invention, the conducting layers are made by using a conductor fired at not higher than 750° C. and, hence, there can be used a resistor fired at a temperature higher than the above temperature. In particular, it is desired to use an inexpensive $RuO_2$ resistor. When the conducting layers had been formed of the copper-containing conductor fired at a temperature of not lower than 900° C., the $RuO_2$ resistor had been reduced and decomposed by the nitrogen gas that formed the atmosphere for firing the conducting layers. In the present invention, however, the conducting layers are fired at not higher than 750° C. and, hence, the $RuO_2$ resistor is not reduced or decomposed by the nitrogen gas.

It is desired that the thick film circuit board of the invention has bonding pad conductors which are the fired silver-containing conductors. When an electric element is to be mounted on the thick film circuit, the bonding pad conductors work to secure the electric element onto the thick film circuit board and to render the circuit and the element to be electrically conductive to each other. The fired silver-containing conductor constituting the bonding pad conductors may have the same composition as that of the silver-containing conductor constituting the conducting portions or may have a different composition. The conducting portions and the bonding pad conductors made of the same conductor can be fired simultaneously to lower the cost of production.

It is desired that the thick film circuit board of the invention has at least a portion of the surface of the conducting layers covered with the insulating material. With at least part of the surface of the conducting layers being covered with the insulating material, the conducting layers maintain electric insulation. Besides, even in case a shock is imparted to the thick film circuit board, the conducting layers are less damaged since physical shock is decreased by the covering layer made of the insulating material. There is no particular limitation on the insulating material covering the conducting layers, and there can be used a protecting glass containing ZnO or PbO that has heretofore been known.

In the thick film circuit board of the invention, the copper-containing conductor constituting the conducting layers is fired at a temperature of not higher than 750° C., and the number of times of firing (number of times of heat treatment) can be decreased during the production. As a result, the cost can be decreased.

A method of producing a thick film circuit board of the invention comprises the steps of:
applying a silver-containing paste which, when fired, is capable of forming conducting portions onto at least the inner peripheral surfaces of the through holes in the base member having through holes;
forming conducting portions by firing the silver-containing paste; and
applying a copper-containing paste which, when fired at a predetermined temperature of not higher than 750° C., is capable of forming conducting layers onto the surfaces of the base member forming the conducting portions depending upon a predetermined circuit pattern, and forming the conducting layers by the firing at the predetermined temperature.

The silver-containing paste which, when fired, is capable of forming conducting portions is applied onto at least the inner peripheral surfaces of the through holes in the base member having through holes in order to form, in the through holes, the conducting portions that render the conducting layers formed on both surfaces of the base member to be electrically conductive to each other.

There is no limitation on the method of applying the silver-containing paste, and there can be used such a method as spray coating, brush coating or printing.

In this case, it is desired to apply the silver-containing paste onto the surfaces of the base member at positions of bonding pad conductors on the circuit pattern to where the element is to be joined. The bonding pad conductors are, then, formed on the surfaces of the base member through the subsequent firing.

It is desired that the silver-containing paste applied to the base member is dried and is, then, used in the subsequent steps. The silver-containing paste that is applied decreases its volume through drying. Therefore, the silver-containing paste is dried in advance to decrease the amount of contraction through the firing.

The conducting portions are formed upon firing the silver-containing paste applied onto the base member. There is no particular limitation on the temperature for firing the silver-containing paste. There is no limitation, either, on the material of the silver-containing paste. That is, there can be used the silver-containing paste that has heretofore been known. Namely, there can be used a paste containing pure silver or silver to which palladium is added.

Thereafter, a copper-containing paste which, when fired at a predetermined temperature of not higher than 750° C., is capable of forming conducting layers, is applied onto the surfaces of the base member forming the conducting portions depending upon a predetermined circuit pattern, and is fired at a predetermined temperature. Through this step, electrically conducting layers are formed on the surfaces of the base member. It is desired that the copper-containing paste is fired in a nitrogen gas atmosphere.

It is desired that the copper-containing paste applied to the base member is dried and, then, is fired. The copper-containing paste that is applied decreases its volume through drying. Therefore, the copper-containing paste is dried in advance to decrease the amount of contraction through the firing.

There is no limitation on the method of applying the copper-containing paste, and there can be used such a method as spray coating, brush coating or printing.

It is desired that the copper-containing paste is applied in a manner of covering at least the conducting portions provided on both surfaces of the base substrate. With the copper-containing paste being applied in a manner of covering the conducting portions on the base member, the conducting portions are not exposed on the surfaces of the thick film circuit board. Being covered with the conducting layers, the conducting portions made of the silver-containing conductor formed on the surfaces of the base member are suppressed from migrating or forming an insulating sulfide (AgS).

It is desired that the silver-containing paste fills the through holes. With the through holes being filled with the silver-containing paste, the conducting portions fills the through holes in the thick film circuit board that is produced. The thick film circuit board exhibits the above-mentioned effect.

It is desired that the copper paste is applied to cover the surfaces of the conducting portions formed filling the through holes. In the thick film circuit board that is produced, the silver-containing conductor is not exposed at the ends of the conducting portions filling the through holes, and no migration takes place. As a result, the thick film circuit features improved reliability.

It is desired that a step is included for forming resistors on the surfaces of the base member by applying a resistor paste capable of forming a resistor upon firing. Thus, the resistors are formed on the surfaces resistors, the timing for applying the resistor paste differs depending upon the temperature at which the resistor paste is fired. Concretely speaking, when the temperature for firing the resistor paste is higher than the temperature for firing the silver-containing paste, the resistor paste is applied before the silver-containing paste is applied to the base member. When the temperature for firing the resistor paste is lower than the temperature for firing the silver-containing paste but is higher than the temperature for firing the copper-containing paste, the resistor paste is applied after the conducting portions are formed but before the copper-containing paste is applied. When the temperature for firing the resistor paste is lower than the temperature for firing the copper-containing paste, it is desired that the resistor paste is applied after the conducting layers are formed. When the temperature for firing the resistor paste is nearly the same as the temperature for firing the silver-containing paste, it is desired that the resistor paste is fired simultaneously with the silver-containing paste. When the silver paste is the one of the Ag—Pd-containing types and the resistor paste is the one of the $RuO_2$ types, the silver paste and the resistor paste can be fired being heated at 850° C. in the atmosphere.

The resistor paste may be the one that has heretofore been known. As the resistor paste, there can be used a paste containing a $RuO_2$-containing resistor, a paste containing a $SnO_2$-containing resistor or a paste containing a $LaB_6$-containing resistor.

There is no limitation on the method of applying the resistor paste, and there can be used such a spray coating, a brush coating or a printing method.

In the method of producing the thick film circuit board of the invention, the base member can be made of a member that has heretofore been used as the base member for the thick film circuit board. As the base member, there can be used a ceramic board having heat resistance and insulating property. Namely, it is desired that the base member is made of ceramic. The ceramic forming the base member may be the one that has heretofore been known. It is desired that the ceramic is an alumina ceramic.

It is desired that a step is included for applying a glass material capable of forming a protection glass onto the surfaces of the base member followed by firing. Upon forming the protection glasses on the surfaces of the thick film circuit board, the conducting layers and the conducting portions of the thick film circuit board are not exposed to exhibit improved properties such as electric insulation and weather-proof property. The protection glass may be the one of the ZnO-containing or the PbO-containing types that has heretofore been known.

The method of producing the first thick film circuit board of the invention is capable of producing the first thick film circuit board described above.

The first integrated circuit device of the invention includes the first thick film circuit board and the electric element mounted on the thick film circuit board. Namely, the integrated circuit board is the one produced by mounting the electric element on the first thick film circuit board. The first integrated circuit device of the invention exhibits the same effect as that of the above first thick film circuit board.

There is no particular limitation on the electric element provided it is a member mounted on the thick film circuit board. Examples include such a member as power element, capacitor, resistor or jumper lead.

(Second Invention)

A thick film circuit board of the present invention is constituted by a base member, conducting layers, conducting portions and conductors.

The base member is made of an insulating member having through holes penetrating through at predetermined positions. The base member is a member that has heretofore been used as a base member for the thick film circuit boards. As the base member, there can be used a plate-like ceramic board having heat resistance and insulating property. Namely, the base member is desirably made of ceramic. The ceramic forming the base member may be the one that has heretofore been known. The ceramic is desirably an alumina ceramic.

The conducting layers are formed on both surfaces of the base member depending upon a predetermined circuit pattern. Both surfaces of the base member stand for both surfaces of the base member in which the through holes are opening. The conducting layers are forming electric circuits on the base member.

The conducting portions are formed in the through holes to render the conducting layers formed on both surfaces of the base member to be electrically connected to each other. Electric circuits are formed on both surfaces of the base member as the conducting portions electrically connect together the conducting layers formed on both surfaces of the base member, and the thick film circuit board is realized in a small size. With the conducting portions being formed in the through holes, further, the conducting layers need not be connected to each other through the outer side of the base member. Therefore, the thick film circuit can be realized in a highly densely integrated form, and the thick film circuit board can be obtained in a small size.

The thick circuit board of the invention has conductors in the through holes for closing the openings of at least the one side. With the openings of at least the one side being closed, the electric element can be mounted on the openings that are closed.

With the openings of at least the one side being closed, further, the surfaces of the thick film circuit board are not dented to suppress the occurrence of such problems as defective opening and increased resistance at the corners of the through holes.

Concretely speaking, in a state where the openings on the one side of the through holes are not closed, the surfaces are dented in the opening portions of the through holes. If the element is joined onto the dents by soldering, there develops voids in the solder, cracks develop from the defective void portions due to thermal stress in the junction areas, and the openings become defective.

Besides, if the conductor constituting the conducting portions does not have enough thickness at the corners of the openings of the through holes, the conductor is all absorbed by the solder and the resistance increases in the through hole portions. To cope with this problem, it can be contrived to maintain the thickness of the conductor and to flatten the through hole portions making, however, it necessary to repetitively impart (print) the conductor resulting in an increase in the number of the working steps and in an increase in the cost as a whole.

Further, the conductor imparted to the inner peripheral surfaces of the through holes shrinks due to the firing, and the through hole portions are dented. To fill the dents, the conductor must be imparted and fired again.

As described above, it is desired that an electronic part is mounted on the openings on one side of the through hole.

There is no limitation on the material of the conductor closing the openings on one side of the through holes. For example, the conductor an be formed by using a material that forms the conducting portions, a material that forms the conducting layers, or any other material having electric conductivity. Desirably, the conductor is of the same material as the conducting layers. The conductor of the same material as that of the conducting layers can be formed at the time of forming the conducting layers.

It is desired that the conducting layers are formed by using a copper-containing conductor fired at not higher than 750° C., and the conducting portions are formed by using a silver-containing conductor. Usually, the silver-containing conductor used for the thick film circuit board is fired at a temperature of about 850° C. Namely, in the thick film circuit board of the present invention, the conducting layers are fired at a temperature lower than a temperature at which the conducting portions are fired. After the conducting portions are fired, the conducting layers can be fired. The conducting portions made of the silver-containing conductor can be fired in an atmosphere. Therefore, the conducting portions are fired at a low cost.

The silver-containing conductor forming the conducting portions is the one that has heretofore been known. Namely, there can be used a conductor such as pure silver or silver to which palladium is added.

The copper-containing conductor forming the conducting layers is fired at a temperature of not higher than 750° C. The copper-containing conductor is fired in an inert gas atmosphere. Here, the inert gas atmosphere may be that of gas that does not react with the copper-containing conductor, such as of nitrogen, helium, neon or argon. Among them, a nitrogen gas is desirable as it is inexpensive.

The copper-containing conductor forming the conducting layers may be any known copper-containing conductor provided it has been fired at a temperature of not higher than 750° C. Preferably, the conductor is the one that is fired at 600 to 700° C.

It is desired that the conducting layers have a resistor that is fired. The resistor may be the one that has heretofore been known. As the resistor, there can be used an $RuO_2$ resistor, an $SnO_2$ resistor or an $LaB_6$ resistor.

It is desired that the resistor is fired at a temperature higher than the temperature at which the conducting layers are fired. Namely, the resistor is fired in advance at a predetermined position on the surface of the base member and, then, the conducting layers are formed. By forming the resistor in the base member, no limitation is imposed on the conditions for firing the resistor. That is, there can be used the resistor fired in the atmosphere.

In the thick film circuit board of the invention, when the conducting layers are made by using a conductor fired at not higher than 750° C., there can be used a resistor fired at a temperature higher than the above temperature. In particular, it is desired to use an inexpensive $RuO_2$ resistor. When the conducting layers had been formed of the copper-containing conductor fired at a temperature of not lower than 900° C., the $RuO_2$ resistor had been reduced and decomposed by the nitrogen gas that formed the atmosphere for firing the conducting layers. In the present invention, however, the conducting layers are fired at not higher than 750° C. and, hence, the $RuO_2$ resistor is not reduced or decomposed by the nitrogen gas.

It is desired that the thick film circuit board of the invention has bonding pad conductors which are the fired silver-containing conductors. When an electric element is to be mounted on the thick film circuit, the bonding pad conductors work to secure the electric element onto the thick film circuit board and to render the circuit and the element to be electrically connected to each other. The fired silver-containing conductor constituting the bonding pad conductors may have the same composition as that of the silver-containing conductor constituting the conducting portions or may have a different composition. The conducting portions and the bonding pad conductors made of the same conductor can be fired simultaneously to lower the cost of production.

It is desired that the thick film circuit board of the invention has at least a portion of the surface of the conducting layers covered with the insulating material. With at least part of the surface of the conducting layers being covered with the insulating material, the conducting layers maintain electric insulation. Besides, even in case a shock is imparted to the thick film circuit board, the conducting layers are less damaged since physical shock is decreased by the covering layer made of the insulating material. There is no particular limitation on the insulating material covering the conducting layers, and there can be used a protecting glass of the containing of ZnO or PbO that has heretofore been known.

A method of producing a second thick film circuit board of the invention comprises the steps of:

forming conducting portions in at least the inner peripheral surfaces of the through holes in the base member having the through holes; and applying a copper-containing paste which, when fired, is capable of forming conducting layers onto the surfaces of the base member forming the conducting portions depending upon a predetermined circuit pattern in a manner to cover the openings on the one side of the through holes, and forming the conducting layers by firing at the predetermined temperature.

According to the production method of the invention, conducting layers are formed to cover the openings on the one side of the through holes after the conducting portions are formed on at least the inner peripheral surfaces of the through holes. Therefore, there is produced a thick film circuit board closing the openings on the one side of the through holes.

It is desired that the step of forming the conducting portions includes a step of applying the silver-containing paste which, when fired, is capable forming conducting portions, and a step of forming conducting portions by firing the silver-containing paste.

The silver-containing paste which, when fired, is capable of forming conducting portions is applied onto at least the inner peripheral surfaces of the through holes in the base member having through holes in order to form, in the through holes, the conducting portions that render the conducting layers formed on both surfaces of the base member to be electrically connected to each other.

There is no limitation on the method of applying the silver-containing paste, and there can be used such a method as spray coating, brush coating or printing.

It is desired that the silver-containing paste is applied onto the inner peripheral surfaces of the through holes without closing the through holes. Namely, it is desired that the through holes are not closed by the conducting portions. The silver-containing paste is applied like a film. It is desired that the silver-containing paste is thickly (with a greater thickness) applied onto the corners of the openings of the through holes on where the electric element is mounted.

In this case, it is desired to apply the silver-containing paste onto the surfaces of the base member at positions of bonding pad conductors on the circuit pattern to where the element is to be joined. The bonding pad conductors are, then, formed on the surfaces of the base member through the subsequent firing.

It is desired that the silver-containing paste applied to the base member is dried and is, then, used in the subsequent steps. The silver-containing paste that is applied decreases its volume through drying. Therefore, the silver-containing paste is dried in advance to decrease the amount of contraction through the firing.

The conducting portions are formed upon firing the silver-containing paste applied onto the base member. There is no particular limitation on the temperature for firing the silver-containing paste. There is no limitation, either, on the material of the silver-containing paste. That is, there can be used the silver-containing paste that has heretofore been known. Namely, there can be used a paste containing pure silver or silver to which palladium is added.

The copper-containing paste which, when fired, is capable of forming conducting layers, is applied onto the surfaces of the base member forming the conducting portions depending upon the predetermined circuit pattern in a state where the openings on the one side of the through holes are covered, and is fired at a predetermined temperature to form conducting layers. There is thus produced a thick film circuit board having openings on the one side of the through holes which are closed by the conducting layer.

It is desired that the copper-containing paste is filling the through holes. With the through holes being filled with the copper-containing paste, the conducting layers fill the through holes in the thick film circuit board that is produced. The thick film circuit board exhibits the above-mentioned effect as well as improved heat-radiating performance.

It is desired that the copper-containing paste is fired at a temperature of not higher than 750° C.

It is desired that the copper-containing paste is fired in the nitrogen gas atmosphere.

It is desired that the copper-containing paste applied to the base member is dried and is, then, fired. The copper-containing paste that is applied decreases its volume through drying. Therefore, the copper-containing paste is dried in advance to decrease the amount of contraction through the firing.

There is no limitation on the method of applying the copper-containing paste, and there can be used a method such as spray coating, brush coating or printing.

It is desired that a step is included for forming resistors on the surfaces of the base member by applying a resistor paste capable of forming a resistor upon firing. Thus, the resistors are formed on the surfaces of the base member. In the step of forming the resistors, the timing for applying the resistor paste differs depending upon the temperature at which the resistor paste is fired. Concretely speaking, when the temperature for firing the resistor paste is higher than the temperature for firing the silver-containing paste, the resistor paste is applied before the silver-containing paste is applied to the base member. When the temperature for firing the resistor paste is lower than the temperature for firing the silver-containing paste but is higher than the temperature for firing the copper-containing paste, the resistor paste is applied after the conducting portions are formed but before the copper-containing paste is applied. When the temperature for firing the resistor paste is lower than the temperature for firing the copper-containing paste, it is desired that the resistor paste is applied after the conducting layers are formed. When the temperature for firing the resistor paste is nearly the same as the temperature for firing the silver-containing paste, it is desired that the resistor paste is fired simultaneously with the silver-containing paste. When the silver paste is the one of the Ag—Pd-containing and the resistor paste is the one of the $RuO_2$ type, the silver paste and the resistor paste can be fired being heated at 850° C. in the atmosphere.

The resistor paste may be the one that has heretofore been known. As the resistor paste, there can be used the one containing $RuO_2$-containing resistor, $SnO_2$-containing resistor or $LaB_6$-containing resistor.

There is no limitation on the method of applying the resistor paste, and there can be used a method such as spray coating, brush coating or printing.

In the method of producing the thick film circuit board of the invention, the base member can be made of a member that has heretofore been used as the base member for the thick film circuit board. As the base member, there can be used a ceramic board having heat resistance and insulating property. Namely, it is desired that the base member is made of ceramic. The ceramic forming the base member may be the one that has heretofore been known. It is desired that the ceramic is an alumina ceramic.

It is desired that a step is included for applying a glass material capable of forming a protection glass onto the surfaces of the base member followed by firing. Upon forming the protection glasses on the surfaces of the thick film circuit board, the conducting layers and the conducting portions of the thick film circuit board are not exposed to exhibit improved properties such as electric insulation and weatherproof property. The protection glass may be the one of the ZnO-containing or the PbO-containing that has heretofore been known.

The method of producing the second thick film circuit board of the invention is capable of producing the second thick film circuit board described above.

The second integrated circuit device of the invention includes the second thick film circuit board and the electric element mounted on the thick film circuit board. Namely, the integrated circuit board is the one produced by placing the electric element on the second thick film circuit board. The second integrated circuit device of the invention exhibits the same effect as that of the above second thick film circuit board.

There is no particular limitation on the electric element provided it is a member mounted on the thick film circuit board. Examples include such a member as a power element, a capacitor, a resistor or a jumper lead.

EXAMPLES

The invention will now be described by way of Examples. Thick film circuit boards were produced as Examples of the invention.

Example 1

There was prepared a plate-like alumina ceramic base member 1 having through holes formed therein according to a conventional method. FIG. 1 is a sectional view illustrating the vicinity of a through hole 10 in the base member 1.

A known Ag-containing conductor paste 2 was applied onto the inner peripheral surface 10a of the through hole 10 in the base member 1.

Figure 2:
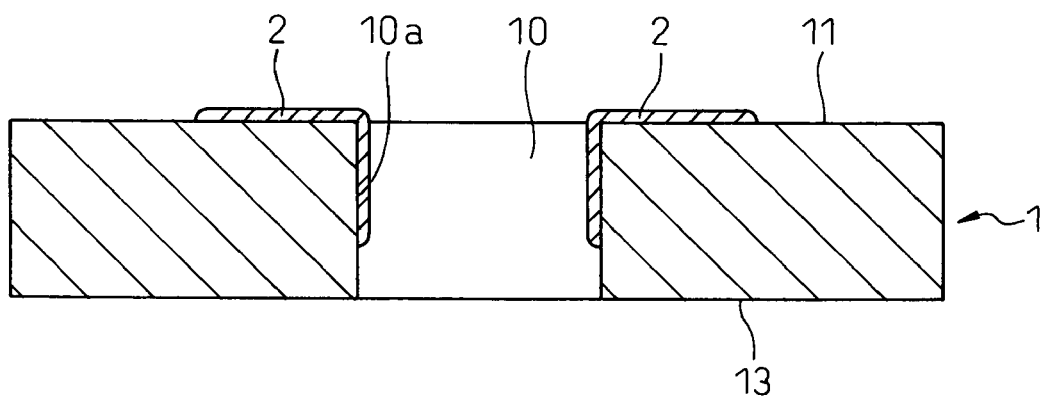
FIG. 2 is a sectional view of the base member to which an Ag-containing conductor paste is applied from the side of the one surface according to Example 1.

First, the Ag-containing conductor paste 2 was applied onto the peripheral surface of the through hole 10 from an opening 12 opened in one surface 11 of the base member 1 and was dried. At this time, the Ag-containing conductor paste 2 was applied onto the peripheral surface 10a of the through hole 10 beyond the center in the lengthwise direction of the through hole 10. The Ag-containing conductor paste 2 was applied onto the peripheral surface 10a of the through hole 10 according to a conventional method. FIG. 2 is a sectional view illustrating the vicinity of the through hole 10 in the base member 1.

Figure 3:
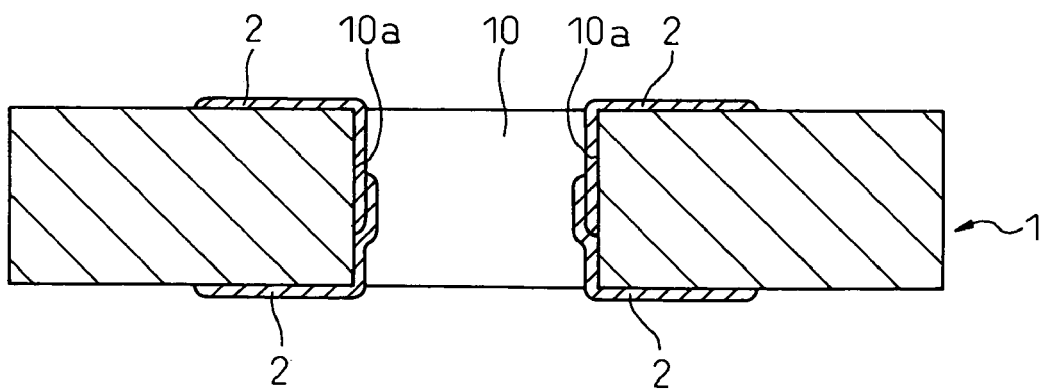
FIG. 3 is a sectional view of the base member to which the Ag-containing conductor paste is applied from the side of the other surface according to Example 1.

Next, the Ag-containing conductor paste 2 was applied onto the inner peripheral surface of the through hole 10 from the opening 14 of the through hole opened in the other surface 13 of the base member 1 and was dried. At this moment, the Ag-containing conductor paste 2 was applied onto the inner peripheral surface 10a of the through hole 10 beyond the center in the lengthwise direction of the through hole 10. Therefore, the Ag-containing conductor paste 2 applied onto the inner peripheral surface 10a of the through hole 10 was continuous in the lengthwise direction of the through hole 10. The Ag-containing conductor paste 2 was applied onto the inner peripheral surface 10a of the through hole 10 according to the conventional method. FIG. 3 is a sectional view illustrating the vicinity of the through hole 10 in the substrate 1.

The Ag-containing conductor paste 2 was applied onto the base member 1, i.e., was applied not only to the inner peripheral surface 10a of the through hole 10 but also to near both openings 12 and 14 of the through hole 10 in the surfaces of the base member 1.

The base member 1 to which the Ag-containing conductor paste 2 was applied was fired in the atmosphere at 850° C. Therefore, the Ag-containing conductor paste 2 was fired to thereby form a conducting portion comprising the Ag-containing conductor. The conducting portion renders both openings of the through hole 10 to be electrically conductive to each other.

Figure 4:
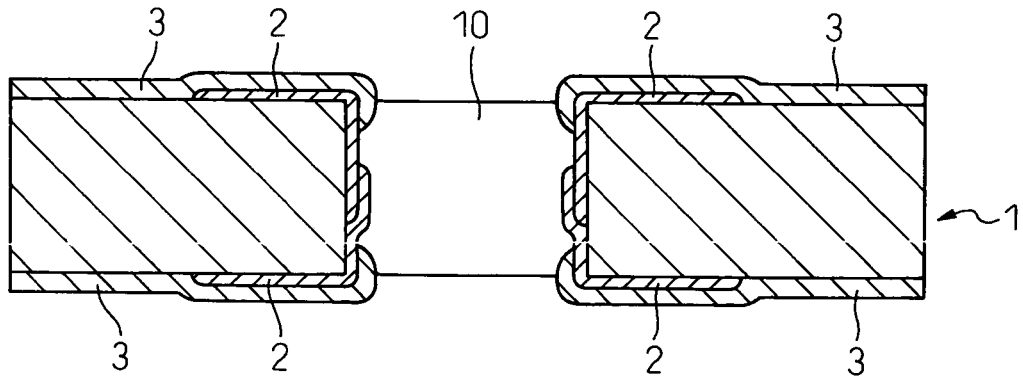
FIG. 4 is a sectional view of a thick film circuit board according to Example 1.

Then, a known Cu-containing conductor paste 3 was applied onto the surfaces 11 and 13 of the base member 1 so as to form a predetermined circuit pattern, and was dried. At this moment, the Cu-containing conductor paste was so applied as to cover the Ag-containing conductor of the Ag-containing conductor paste 2 that has been applied onto the surfaces 11 and 13 of the base plate 1. FIG. 4 is a sectional view illustrating the vicinity of the through hole 10 in the substrate 1. In this drawing, reference numeral 2 denotes the conducting portion formed by firing the Ag-containing conductor paste.

The Cu-containing conductor paste 3 applied onto the base member 1 was dried and was fired at 600 to 700° C. in a nitrogen gas atmosphere. Therefore, the Cu-containing conductor paste 3 was fired to form a conducting layer comprising the Cu-containing conductor.

The thick film circuit board of this Example was produced through the above-mentioned procedure.

The thick circuit board of this Example was produced by firing the conducting portions in the atmosphere and, hence, at a decreased cost.

Example 2

A thick film circuit board was produced in the same manner as in Example 1 but applying the Ag-containing conductor paste a plural number of times for forming the conducting portions.

Figure 5:
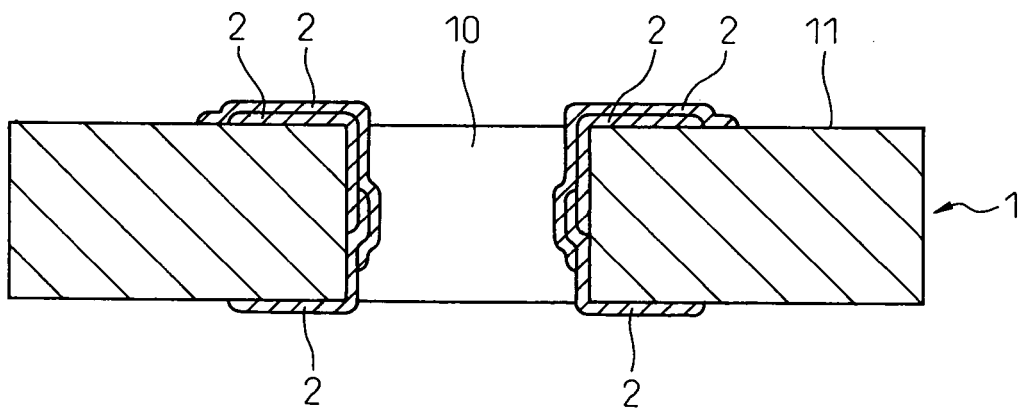
FIG. 5 is a sectional view of the base member to which the Ag-containing conductor paste is applied in the second time from the side of the one surface according to Example 2.
Figure 6:
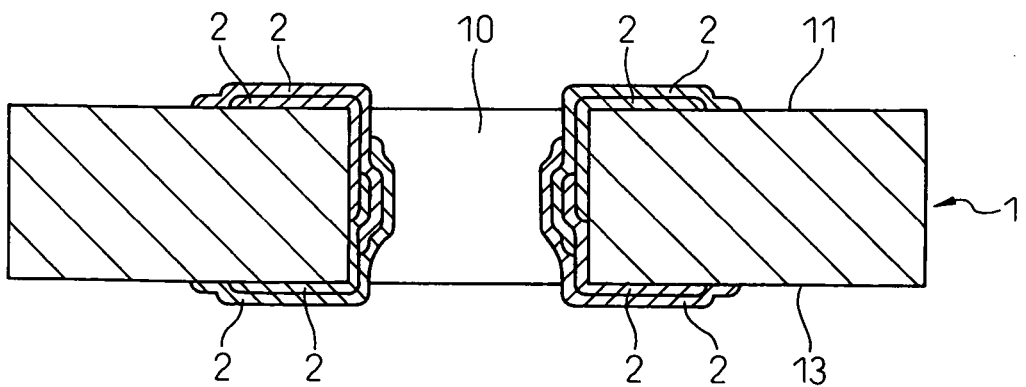
FIG. 6 is a sectional view of the base member to which the Ag-containing conductor paste is applied in the second time from the side of the other surface according to Example 2.

First, the base member 1 was prepared in the same manner as in Example 1. Then, the Ag conductor paste 2 was applied onto the inner peripheral surfaces of the through holes 10 in the base member 1 and was dried in the same manner as in Example 1. Then, similarly, the Ag-containing conductor paste 2 was applied onto the inner peripheral surfaces of the through holes 10 from the side of the one surface and was dried. FIG. 5 is a sectional view illustrating the vicinity of the through hole 10 in the base member 1. Similarly, further, the Ag-containing conductor paste 2 was applied from the side of the other surface 13 and was dried. FIG. 6 is a sectional view illustrating the vicinity of the through hole 10 in the base member 1.

Figure 7:
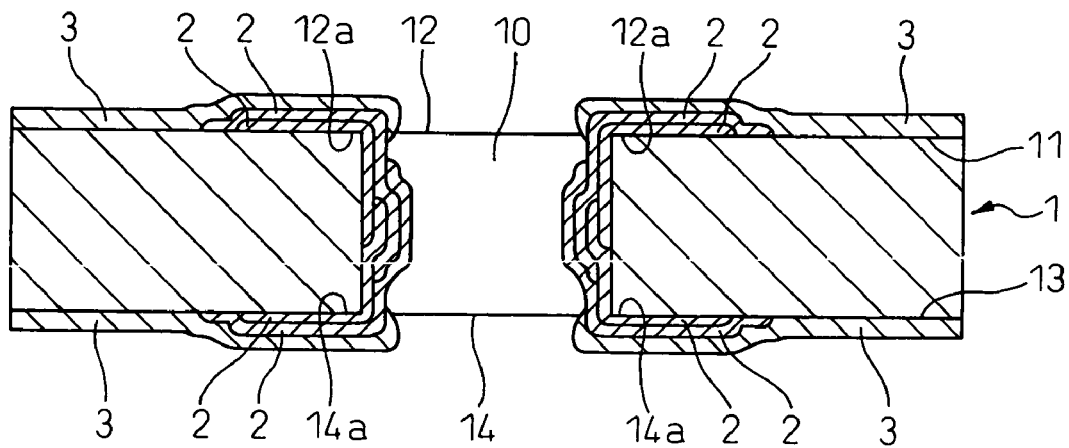
FIG. 7 is a sectional view of the base member to which a Cu-containing conductor paste is applied according to Example 2.

Thereafter, the Ag-containing conductor paste was fired, and the Cu-containing conductor paste was applied, dried and fired under the same conditions as those in Example 1. FIG. 7 is a sectional view illustrating the vicinity of the through hole 10 in the base member 1 to which the Cu-containing conductor paste 3 is applied. In FIG. 7, reference numeral 2 denotes the conducting portions formed by firing the Ag-containing conductor paste.

Thus, the thick film circuit board of this Example was produced.

The thick film circuit board of this Example exhibits the same effect as that of Example 1.

In the thick film circuit board of this Example, the Ag-containing conductor forming the conducting portions is maintaining a sufficiently large thickness near the openings 12 and 14 of the through holes 10 in the base member 1. In particular, the Ag-containing conductor is maintaining a thickness at the corners 12a and 14a of the openings 12 and 14 of the through holes 10. That is, when the element is soldered near the through holes 10, an increase in the resistance is prevented since the conductor of the conducting portion is not all absorbed by the solder; i.e., the Ag-containing conductor maintains a thickness sufficient for the electric conduction, and there is obtained a thick film circuit having stable performance.

Example 3

First, the base member 1 was prepared in the same manner as in Example 1.

Figure 8:
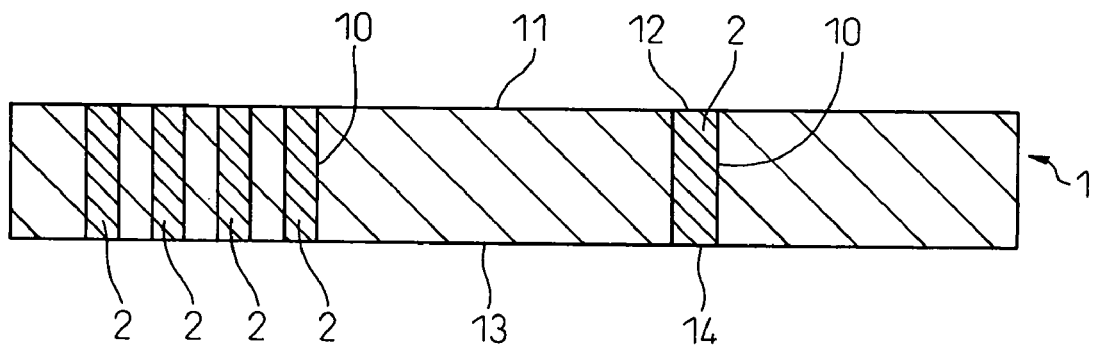
FIG. 8 is a view illustrating a state where the through holes in the base member are filled with the Ag-containing conductor paste according to Example 3.

Then, the Ag-containing conductor paste 2 was forcibly introduced into the through holes 10 from the openings 12 in one surface 11 in a state where the openings 14 of the through holes 10 in the other surface 13 have been closed by a jig. Upon forcibly introducing the Ag-containing conductor paste 2, the Ag-containing conductor paste 2 was filled in the through holes 10. The Ag-containing conductor paste 2 filled in the through holes 10 was dried. FIG. 8 is a sectional view illustrating the vicinity of the through holes 10 in the base member 1.

A resistor paste 4 which, when fired, is capable of forming a resistor was applied onto a predetermined position on the surface of the base member 1, and was dried. In this Example, an $RuO_2$-containing paste was used as the resistor paste 4.

Figure 9:
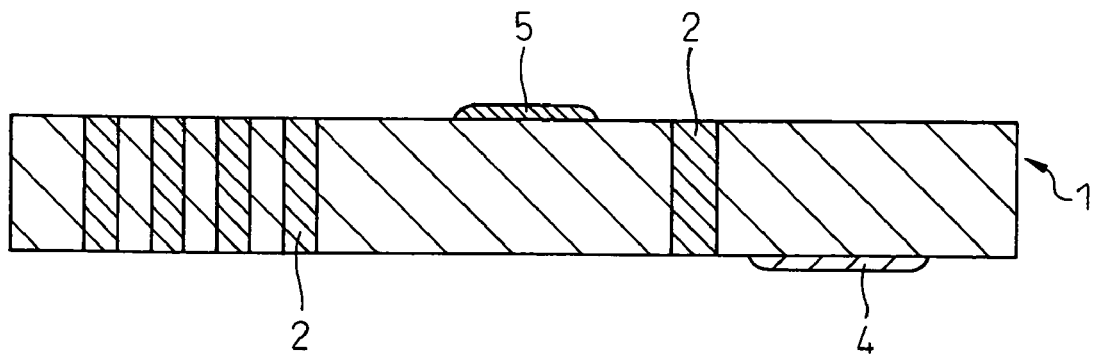
FIG. 9 is a sectional view illustrating the base material to which various pastes are applied according to Example 3.

Further, a bonding paste 5 which, when fired, is capable of forming a bonding pad conductor was applied onto a predetermined position on the surface of the base member 1 and was dried. In this Example, an Ag—Pd-containing paste was used as the bonding paste 5. FIG. 9 illustrates the base member 1 onto which the resistor paste 4 and the bonding paste 5 have been applied. In this Example, the Ag-containing conductor paste 2, the resistor paste 4 and the bonding paste 5 were applied in this order. However, there is no particular limitation on the order of applying these pastes.

The base member 1 to which the pastes have been applied was fired in the atmosphere at 850° C. Through this firing, the Ag-containing conductor paste 2 filled in the through holes 10 was fired to form conducting portions comprising the Ag-containing conductor. The conducting portions render the openings on both sides of the through holes 10 to be electrically conductive to each other.

Figure 10:
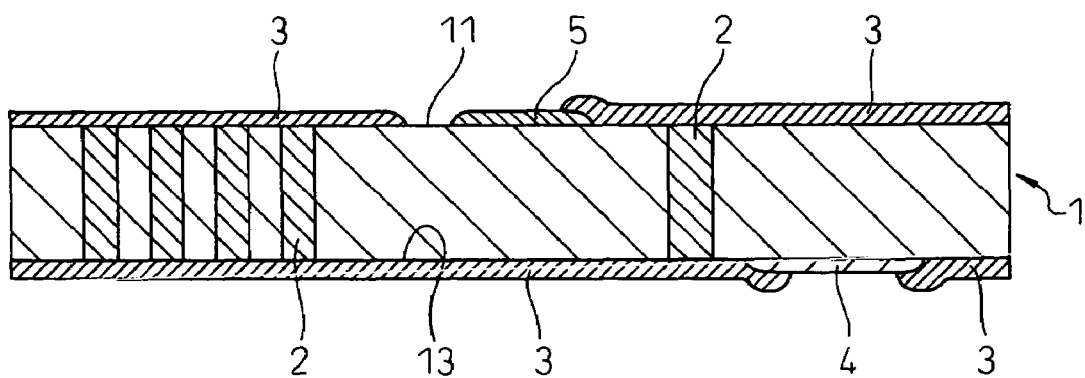
FIG. 10 is a sectional view of the base member on which conducting layers are formed according to Example 3.

Like in Example 1, the Cu-containing conductor paste 3 was applied onto the surfaces 11 and 13 of the base member 1 so as to form predetermined circuit patterns, and was dried. Here, the Cu-containing conductor paste 3 was applied in a manner to cover the surfaces of the conducting portions filling the through holes 10. FIG. 10 is a sectional view of the base member 1 to which the Cu-containing conductor paste 3 is applied. In FIG. 10 and in the subsequent drawings of this Example, reference numeral 2 denotes conducting portions formed by firing the Ag-containing conductor paste, 4 denotes a resistor formed by firing the resistor paste, and 5 denotes a bonding pad formed by firing the bonding paste.

The Cu-containing conductor paste 3 applied onto the base member 1 was dried and was, then, fired in a nitrogen gas atmosphere at 600 to 700° C. Through this firing, the Cu-containing conductor paste 3 was fired to form the conducting layers comprising the Cu-containing conductor.

Figure 11:
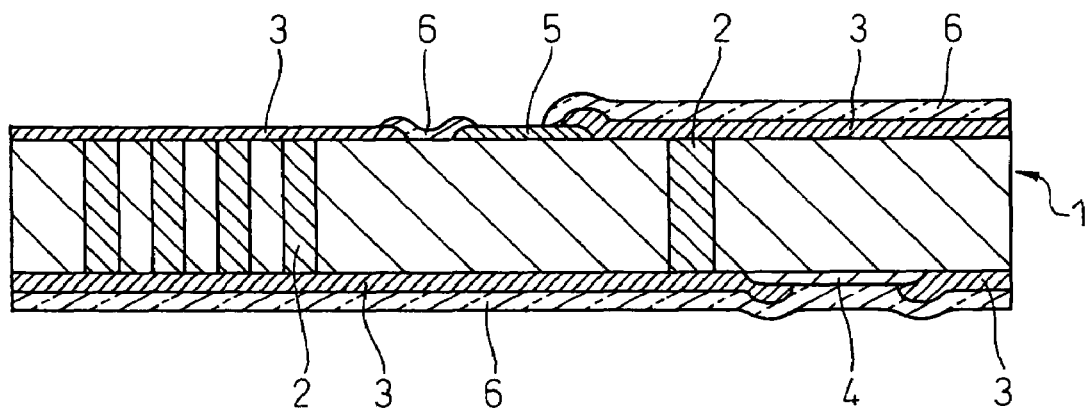
FIG. 11 is a sectional view of the base member on which protecting glasses are formed according to Example 3.

A starting material capable of forming a protection glass was applied onto the surfaces 11 and 13 of the base member 1, and was fired to form the protection glass 6. FIG. 11 is a sectional view of the base member 1 on which the protection glass 6 is formed. In FIG. 11 and in the subsequent drawings of this Example, reference numeral 3 denotes conducting layers formed by firing the Cu-containing conductor paste.

Thus, the thick film circuit board of this Example was produced.

The thick film circuit board of this Example exhibits the same effect as those of Examples 1 and 2.

Figure 12:
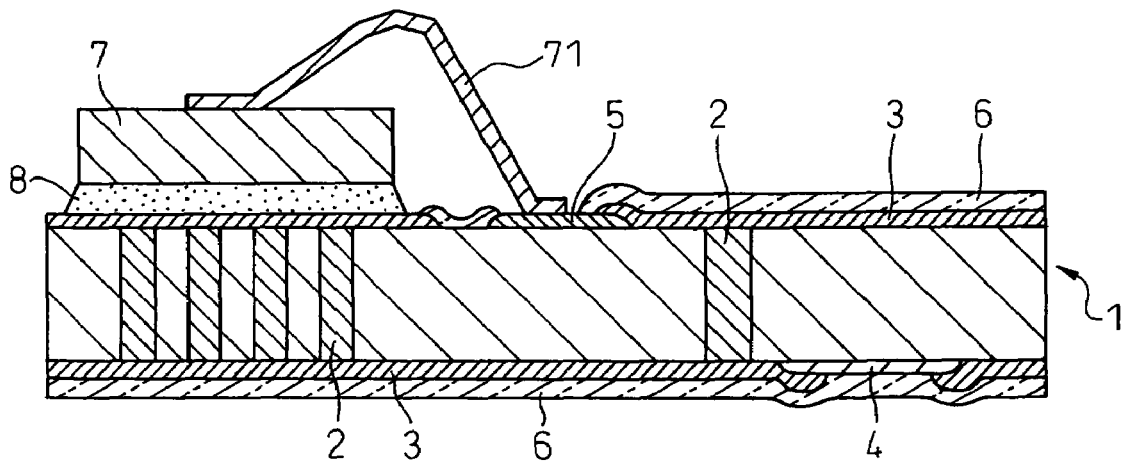
FIG. 12 is a view illustrating an integrated circuit device to which a power element is joined according to Example 3.

Referring, for example, to FIG. 12, further, the thick film circuit board of this Example forms an integrated circuit device (thick film circuit) upon joining a power element 7 thereto. Namely, the integrated circuit device is formed by joining the power element 7 to the conducting layer covering the openings 12' of the through holes 10' by using an adhesive 8 having excellent heat conductivity and electric conductivity.

In the above integrated circuit device, heat produced by the power element 7 is conducted to the conducting layer formed on the other surface 13 through the conducting portions filled in the through holes 10' which are located just beneath it. Namely, the heat generated by the power element 7 is radiated from the other surface 13, too. This means that the thick film circuit exhibits the improved heat radiating performance to prevent the thick film circuit from being damaged by the heat which it has generated. Namely, the circuit characteristics are maintained for extended periods of time.

That is, with the through holes 10 being entirely filled with the conducting portions, not only the electric conductivity is maintained near the openings 12, 14 of the through holes 10 but the circuit radiates the heat as well.

Example 4

Figure 13:
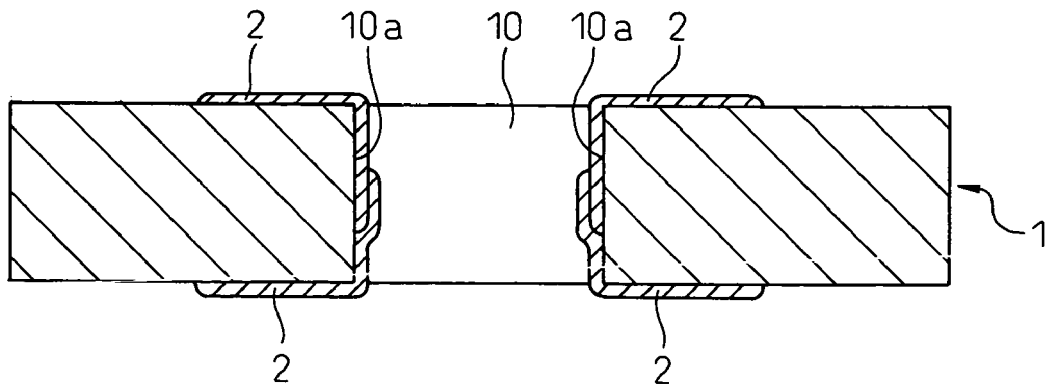
FIG. 13 is a sectional view of the base member to which the Ag-containing conductor paste is applied according to Example 4.

First, the base member 1 was prepared in the same manner as in Example 1, and the Ag-containing conductor paste 2 was applied onto the inner peripheral surfaces of the through holes 10 in the base member 1, and was dried. FIG. 13 is a sectional view illustrating the vicinity of the through hole 10 in the base member 1.

Figure 14:
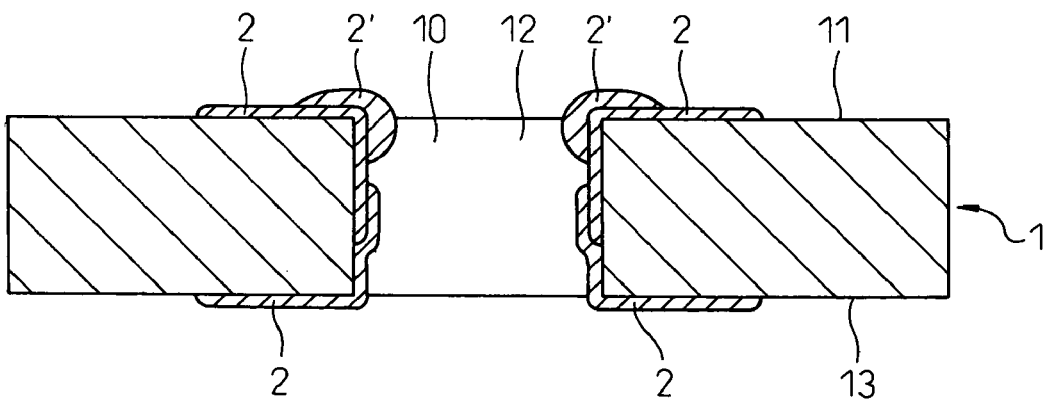
FIG. 14 is a sectional view of the base member in which the Ag-containing conductor paste is applied to corner portions of the openings of the through holes according to Example 4.

Then, the Ag-containing conductor paste 2' was further applied onto the corner portions of the openings 12 of the through holes 10 from the side of the one surface 11. FIG. 14 is a sectional view illustrating the vicinity of the through hole 10 in the base member 1.

The base member 1 on which the Ag-containing conductor paste 2 has been applied was fired by the same means as that of Example 1. Through this firing, the Ag-containing conductor paste 2 was fired to form the conducting portions made of the Ag-containing conductor. The conducting portions render the openings on both sides of the through holes 10 to be electrically conductive to each other. The conducting portions are thickly formed at the corners of the openings 12 on the one side of the through holes 10 in the base member 1 to decrease the opening amount of the openings 12 on the one side.

Figure 15:
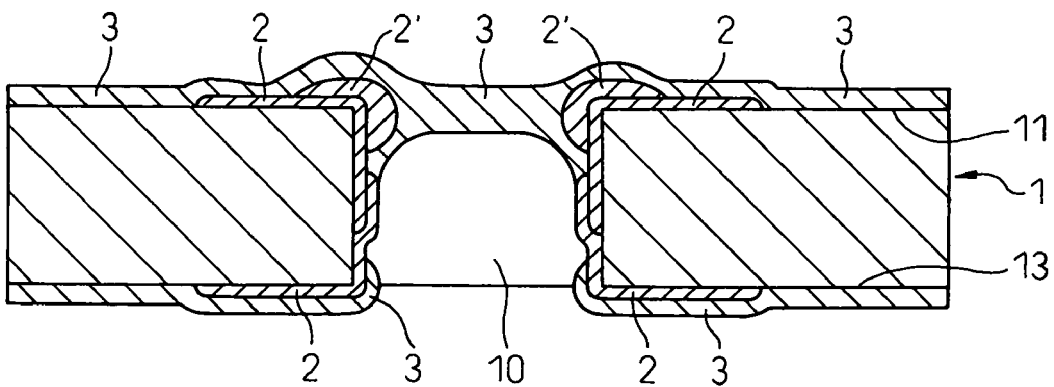
FIG. 15 is a sectional view of the base member to which the Cu-containing conductor paste is applied according to Example 4.

Then, the known Cu-containing conductor paste 3 was applied onto the surfaces 11 and 13 of the base member 1 so as to form predetermined circuit patterns and was dried. At this moment, the Cu-containing conductor paste was so applied as to cover the Ag-containing conductor of the Ag-containing conductor paste 2 that has been applied onto the surfaces 11 and 13 of the base plate 1. The Cu-containing conductor paste was applied in a manner to cover the openings 12 on the one side of the through holes 10 but leaving the openings 13 on the other side opened. FIG. 15 is a sectional view illustrating the vicinity of the through hole 10 in the substrate 1. In this drawing, reference numeral 2 denotes the conducting portion formed by firing the Ag-containing conductor paste.

The Cu-containing conductor paste 3 applied onto the base member 1 was dried and was fired at 600 to 700° C. in a nitrogen gas atmosphere. Therefore, the Cu-containing conductor paste 3 was fired to form the conducting layers comprising the Cu-containing conductor.

The thick film circuit board of this Example was produced through the above-mentioned procedure.

The thick circuit board of this Example has the Cu-containing conductor paste 3 burying the openings 12 on the one side of the through holes 10; i.e., the openings 12 on the one side are closed by the conducting layer. Therefore, the circuit board suppresses the occurrence of voids when the electric element is mounted on the upper side of the through holes.

Example 5

First, the base member 1 was prepared in the same manner as in Example 3, and the Ag-containing conductor paste 2 was applied onto the inner peripheral surfaces of the through holes 10 in the base member 1 and was dried.

Figure 16:
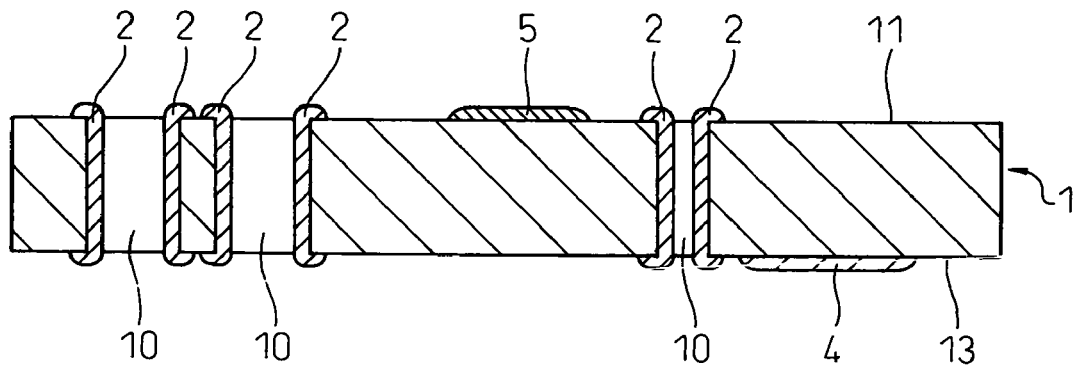
FIG. 16 is a sectional view of the base member to which the Ag-containing conductor paste, a resistor paste and a bonding paste are applied according to Example 5.

The resistor paste 4 which, when fired, is capable of forming a resistor and a bonding paste 5 were applied onto predetermined positions on the surfaces of the base member 1 in the same manner as in Example 3, and were dried. FIG. 16 is a view illustrating the base member 1 to which the resistor paste 4 and the bonding paste 5 are applied.

The base member 1 to which the pastes have been applied was fired in the atmosphere at 850° C. Therefore, the Ag-containing conductor paste 2 filled in the through holes 10 was fired to form conducting portions comprising the Ag-containing conductor. The conducting portions render the openings on both sides of the through holes 10 to be electrically connected to each other.

Figure 17:
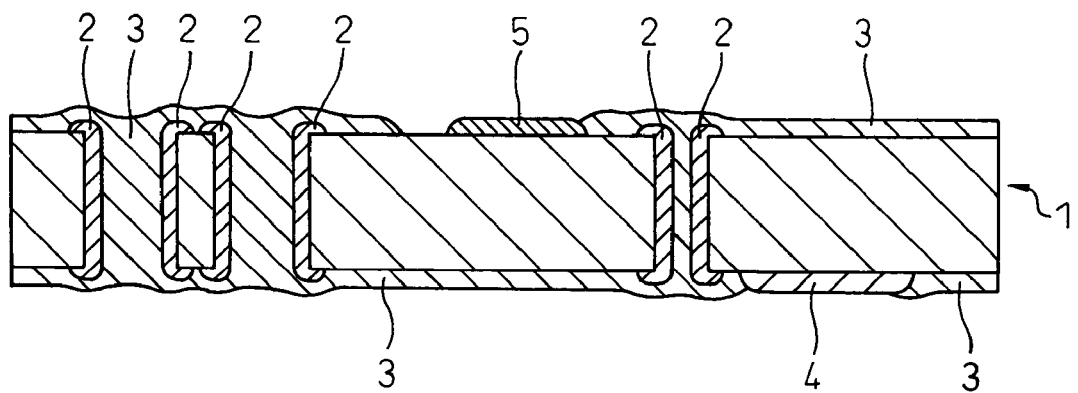
FIG. 17 is a sectional view of the base member to which the Cu-containing conductor paste is applied according to Example 5.

As in Example 1, the Cu-containing conductor paste 3 was applied onto the surfaces 11 and 13 of the base member 1 so as to form predetermined circuit patterns, and was dried. Here, the Cu-containing conductor paste 3 was applied in a manner to fill the through holes 10. FIG. 17 is a sectional view of the base member 1 to which the Cu-containing conductor paste 3 is applied. In FIG. 17 and in the subsequent drawings of this Example 5, reference numeral 2 denotes conducting portions formed by firing the Ag-containing conductor paste, 4 denotes a resistor formed by firing the resistor paste, and 5 denotes a bonding pad formed by firing the bonding paste.

The Cu-containing conductor paste 3 applied onto the base member 1 was dried and was, then, fired in a nitrogen gas atmosphere at 600 to 700° C. Therefore, the Cu-containing conductor paste 3 was fired to form the conducting layers comprising the Cu-containing conductor.

Figure 18:
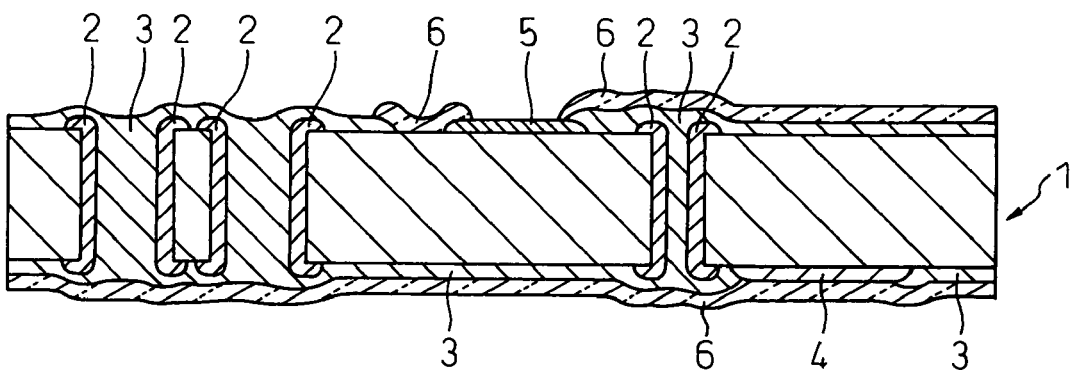
FIG. 18 is a sectional view of the base member on which protecting glasses are formed according to Example 5.

A starting material capable of forming a protection glass was applied onto the surfaces 11 and 13 of the base member 1, and was fired to form the protection glass 6. FIG. 18 is a sectional view of the base member 1 on which the protection glass 6 is formed. In FIG. 18 and in the subsequent drawings of this Example 5, reference numeral 3 denotes conducting layers formed by firing the Cu-containing conductor paste.

Thus, the thick film circuit board of this Example was produced.

The thick film circuit board of this Example exhibits the same effect as that of the thick film circuit board of Example 4.

Figure 19:
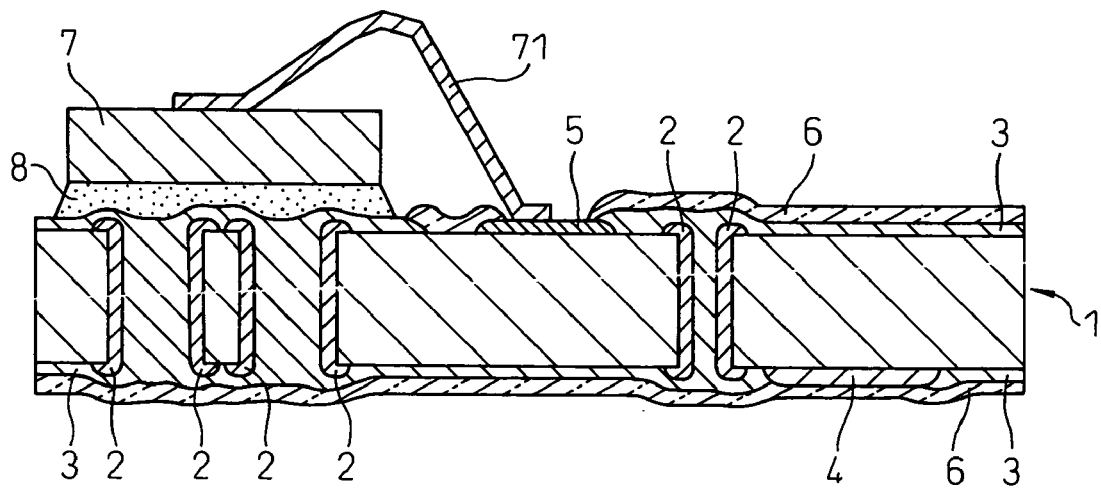
FIG. 19 is a view illustrating an integrated circuit device to which a power element is joined according to Example 5.

Referring, for example, to FIG. 19, further, the thick film circuit board of this Example forms an integrated circuit device (thick film circuit) upon joining a power element 7 thereto. Namely, the integrated circuit device is formed by joining the power element 7 to the conducting layer covering the openings 12 of the through holes 10 by using an adhesive 8 having excellent heat conductivity and electric conductivity.

In the above integrated circuit device, heat produced by the power element 7 is conducted to the conducting layer formed on the other surface 13 through the conducting portions filled in the through holes 10 which are located just beneath it. Namely, the heat generated by the power element 7 is radiated from the other surface 13, too. This means that the thick film circuit exhibits the improved heat radiating performance suppressing the thick film circuit from being damaged by the heat which it has generated. Namely, the circuit characteristics are maintained for extended periods of time.

That is, with the through holes 10 being entirely filled with the conducting portions, not only is the electric conductivity maintained near the openings 12 and 14 of the through holes 10 but the circuit radiates the heat as well.

Example 6

First, the base member 1 was prepared in the same manner as in Example 3, and the Ag-containing conductor paste 2 was applied onto the inner peripheral surfaces of the through holes 10 in the base member 1 and was dried.

Figure 20:
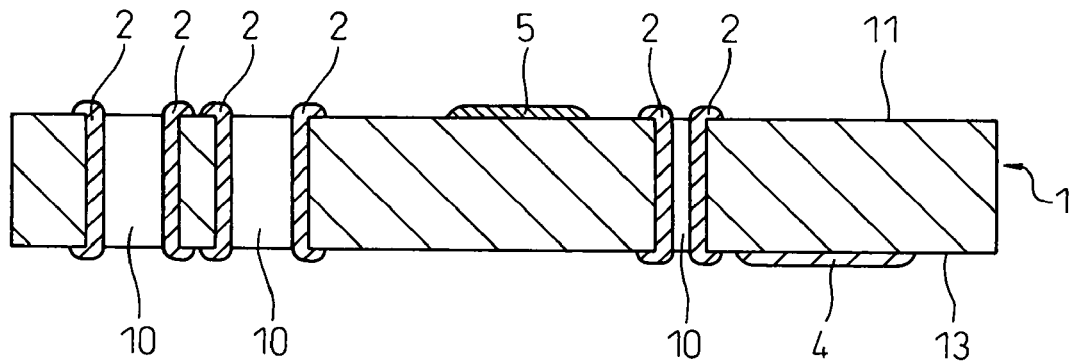
FIG. 20 is a sectional view of the base member to which the Ag-containing conductor paste, the resistor paste and the bonding paste are applied according to Example 6.
Figure 21:
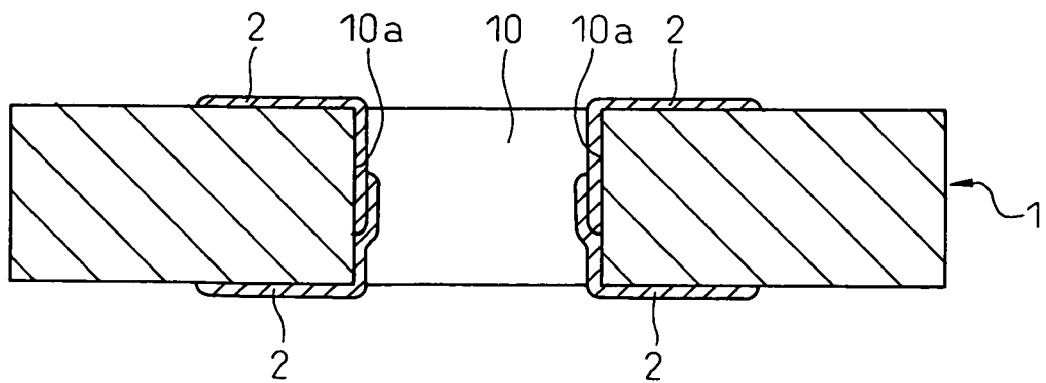
FIG. 21 is a sectional view illustrating the vicinity of the through hole in the base member to which the Ag-containing conductor paste is applied according to Example 6.

The resistor paste 4 which, when fired, is capable of forming a resistor and a bonding paste 5 were applied onto predetermined positions on the surfaces of the base member 1 in the same manner as in Example 3, and were dried. FIG. 20 is a view illustrating the base member 1 to which the resistor paste 4 and the bonding paste 5 are applied. FIG. 21 is a sectional view illustrating the vicinity of the through hole.

The base member 1 to which the pastes have been applied was fired in the atmosphere at 850° C. Therefore, the Ag-containing conductor paste 2 filled in the through holes 10 was fired to form conducting portions comprising the Ag-containing conductor. The conducting portions render the openings on both sides of the through holes 10 electrically connected to each other.

Figure 22:
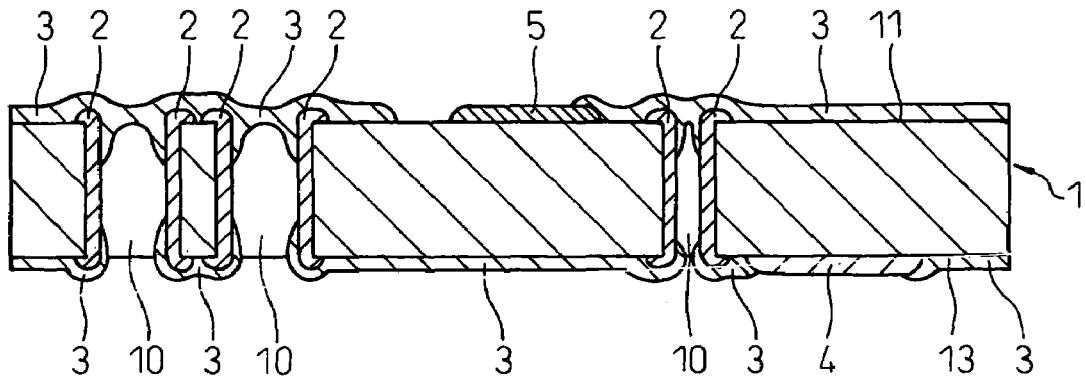
FIG. 22 is a sectional view of the base member to which the Cu-containing conductor paste, the resistor paste and the bonding paste are applied according to Example 6.
Figure 23:
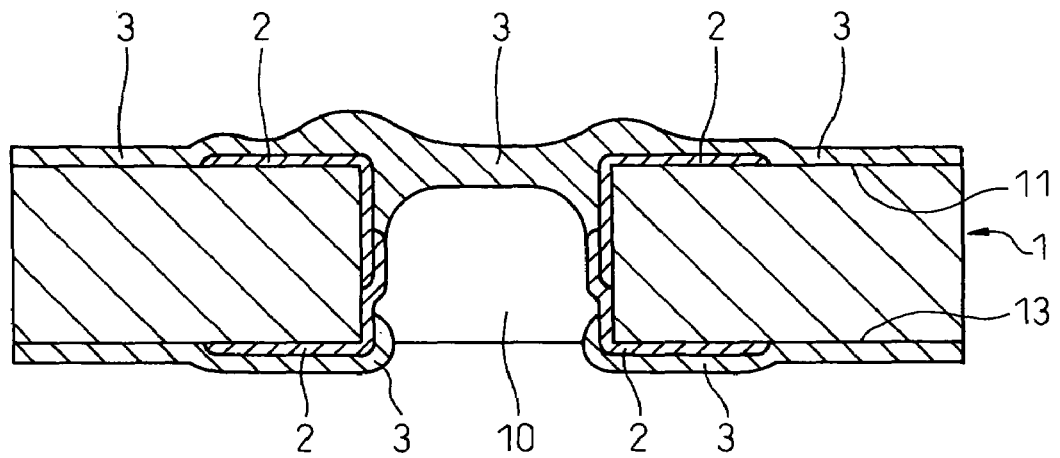
FIG. 23 is a sectional view illustrating the vicinity of the through hole in the base member to which the Cu-containing conductor paste is applied according to Example 6.

As in Example 1, the Cu-containing conductor paste 3 was applied onto the surfaces 11 and 13 of the base member 1 so as to form predetermined circuit patterns, and was dried. Here, the Cu-containing conductor paste 3 was applied in a state where the openings 12 on the one side of the through holes 10 had been closed and the openings 14 on the other side had been opened. FIG. 22 is a sectional view of the base member 1 to which the Cu-containing conductor paste 3 is applied and FIG. 23 is a sectional view illustrating the vicinity of the through hole. In FIG. 23 and in the subsequent drawings of this Example 6, reference numeral 2 denotes conducting portions formed by firing the Ag-containing conductor paste, 4 denotes a resistor formed by firing the resistor paste, and 5 denotes a bonding pad formed by firing the bonding paste.

The Cu-containing conductor paste 3 applied onto the base member 1 was dried and was, then, fired in a nitrogen gas atmosphere at 600 to 700° C. Therefore, the Cu-containing conductor paste 3 was fired to form the conducting layers comprising the Cu-containing conductor.

Figure 24:
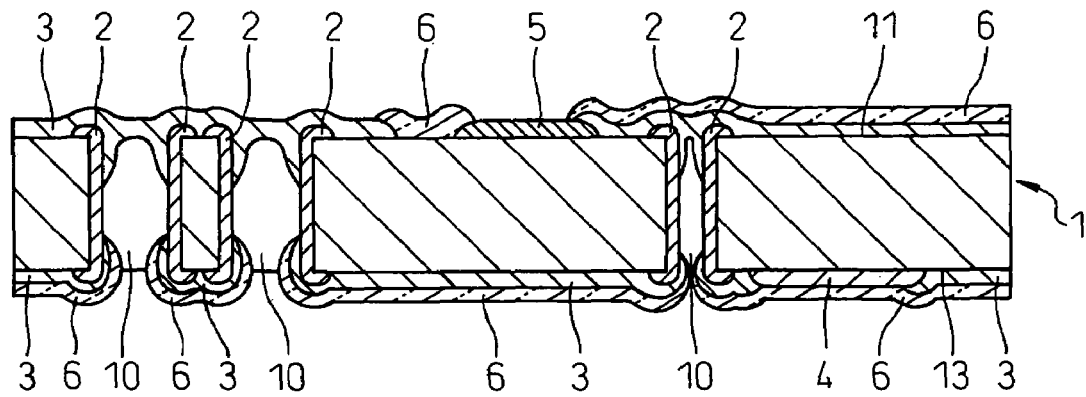
FIG. 24 is a sectional view of the base member on which the protecting glasses are formed according to Example 6.

A starting material capable of forming a protection glass was applied onto the surfaces 11 and 13 of the base member 1, and was fired to form the protection glass 6. FIG. 24 is a sectional view of the base member 1 on which the protection glass 6 is formed. In FIG. 24 and in the subsequent drawings of this Example 6, reference numeral 3 denotes conducting layers formed by firing the Cu-containing conductor paste.

Thus, the thick film circuit board of this Example was produced.

The thick film circuit board of this Example exhibits the same effect as those of the thick film circuit boards of Examples 4 and 5.

Figure 25:
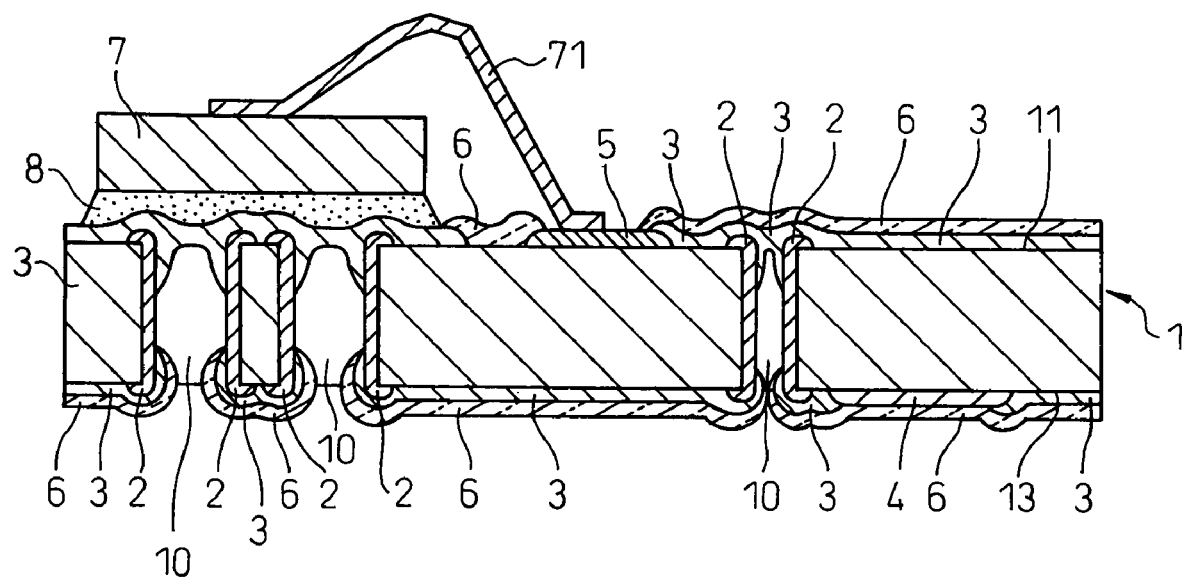
FIG. 25 is a view illustrating an integrated circuit device to which a power element is joined according to Example 6.

Referring, for example, to FIG. 25, further, the thick film circuit board of this Example forms an integrated circuit device (thick film circuit) upon joining a power element 7 thereto. Namely, the integrated circuit device is formed by joining the power element 7 to the conducting layer covering the openings 12 of the through holes 10 by using an adhesive 8 having excellent heat and electrical conductivities.

The invention claimed is:

1. A thick film circuit board comprising:
an insulating base member having through holes penetrating through at predetermined positions thereof;
conducting layers formed on both surfaces of said base member depending upon a predetermined circuit pattern; and
conducting portions formed in said through holes to render the conducting layers formed on both surfaces of said base member to be connected to each other;
wherein said conducting layers are formed in a manner to cover said through holes on one side of said base member but not cover said through holes on the opposite side thereof, and said conducting layer covering said through holes also covering a through hole-inside surface of said conducting portions formed in said through holes around an end periphery thereof and along at least a portion of the length of the through hole, and
wherein the conducting layers are formed by using a copper-containing conductor fired at not higher than 750°

C., and the conducting portions are formed by using a silver-containing conductor.

2. The thick film circuit board according to claim 1, wherein said conducting portions formed in at least the surfaces of said base member are covered with said conducting layers.

3. The thick film circuit board according to claim 1, wherein the conducting portions are formed in said through holes that are filled with said silver-containing conductor.

4. The thick film circuit board according to claim 1, wherein said conducting layers have a resistor formed by firing.

5. The thick film circuit board according to claim 1, wherein said base member is made of ceramic.

6. The thick film circuit board according to claim 5, wherein said ceramic is an alumina ceramic.

7. An integrated circuit device comprising:
a thick film circuit board which includes:
an insulating base member having through holes penetrating through at predetermined positions thereof;
conducting layers formed on both surfaces of said base member depending upon a predetermined circuit pattern; and
conducting portions formed in said through holes to render the conducting layers formed on both surfaces of said base member to be electrically conductive to each other;
wherein said conducting layers are formed in a manner to cover said through holes on one side of said base member but not cover said through holes on the opposite side thereof, and said conducting layer covering said through holes also covering a through hole-inside surface of said conducting portions formed in said through holes around an end periphery thereof and along at least a portion of the length of the through hole, and
wherein the conducting layers are formed by using a copper-containing conductor fired at not higher than 750° C., and the conducting portions are formed by using a silver-containing conductor; and
an electronic part mounted on said conducting layers on the openings on said one side of said base member.

8. A thick film circuit board comprising:
an insulating base member having through holes penetrating through at predetermined positions thereof;
conducting layers formed on both surfaces of said base member depending upon a predetermined circuit pattern; and
conducting portions formed in said through holes to render the conducting layers formed on both surfaces of said base member to be connected to each other;
wherein said conducting layers are formed in a manner to cover said through holes on one side of said base member but not cover said through holes on the opposite side thereof, and said conducting layer covering said through holes also covering a through hole-inside surface of said conducting portions formed in said through holes around an end periphery thereof and along at least a portion of the length of the through hole, and
wherein an electronic part is mounted on said conducting layer on the openings on said one side of said through holes.

9. The thick film circuit board according to claim 8, wherein said conducting layers are formed by using the copper-containing conductor fired at not higher than 750, and said conducting portions are formed by using the silver-containing conductor.

10. The thick film circuit board according to claim 8, wherein said conductors comprise said conducting layers.

11. The thick film circuit board according to claim 8, wherein said base member is a ceramic base member.

12. The thick film circuit board according to claim 11, wherein said ceramic is an alumina ceramic.

13. An integrated circuit device comprising:
a thick film circuit board which includes:
an insulating base member having through holes penetrating through at predetermined positions thereof;
conducting layers formed on both surfaces of said base member depending upon a predetermined circuit pattern, said conducting layers being formed in a manner to cover said through holes; and
conducting portions formed in said through holes to render the conducting layers formed on both surfaces of said base member to be connected to each other;
wherein said conducting layers are formed in a manner to cover said through holes on one side of said base member but not cover said through holes on the opposite side thereof, and said conducting layer covering said through holes also covering a through hole-inside surface of said conducting portions formed in said through holes around an end periphery thereof and along at least a portion of the length of the through hole, and
wherein an electronic part is mounted on said conducting layers on the openings on said one side of said through holes.

* * * * *